United States Patent
Wong et al.

(10) Patent No.: US 6,462,689 B2
(45) Date of Patent: Oct. 8, 2002

(54) DIGITAL TO ANALOG CONVERTER (DAC) HAVING AN ADJUSTABLE DYNAMIC RANGE

(75) Inventors: Isaac H. Wong, Fremont; Jiinyuan Lee, San Jose, both of CA (US)

(73) Assignee: Ishoni Networks, Inc., Santa Clara, CA (US)

( * ) Notice: Subject to any disclaimer, the term of this patent is extended or adjusted under 35 U.S.C. 154(b) by 0 days.

(21) Appl. No.: 09/771,397

(22) Filed: Jan. 25, 2001

(65) Prior Publication Data

US 2002/0097175 A1 Jul. 25, 2002

(51) Int. Cl.$^7$ ................................................. H03M 1/66
(52) U.S. Cl. ........................ 341/144; 341/139; 341/143; 341/152
(58) Field of Search ................................ 341/139, 143, 341/144, 152

(56) References Cited

U.S. PATENT DOCUMENTS

| | | | | |
|---|---|---|---|---|
| 4,811,019 A | * | 3/1989 | Julstrom et al. | 341/143 |
| 5,859,605 A | * | 1/1999 | Raghavan et al. | 341/143 |
| 6,052,076 A | * | 4/2000 | Patton, III et al. | 341/144 |
| 6,181,266 B1 | * | 1/2001 | Toki | 341/152 |
| 6,281,821 B1 | * | 8/2001 | Rhode et al. | 341/144 |
| 6,362,766 B1 | * | 3/2002 | Rowan et al. | 341/152 |

OTHER PUBLICATIONS

Louis, Loai and Roberts, Gordon W., "A single–path Multibit DAC for LP delta–sigma A/D Converters", Department of Electrical Engineering, McGrill University, 1998.*

"Voice and Telephoney Over ATM to the Desktop Specification", The ATM Forum Technical Committee, AF–V–TOA–0083.001, Feb., 1999, pp. 1–50.*

* cited by examiner

Primary Examiner—Michael Tokar
Assistant Examiner—Khai M. Nguyen
(74) Attorney, Agent, or Firm—James S. Hsue; Skjerven Morrill LLP (57) ABSTRACT

A digital to analog converter (DAC) has an adjustable dynamic range. Specifically, the adjustable DAC has a control port that receives a control signal indicative of the dynamic range, and the DAC produces an analog signal of the specified dynamic range in response to a corresponding digital signal. In one embodiment, the adjustable DAC includes a bitstream generator that repeatedly generates a bitstream and a low pass filter that receives and filters the repeated bitstream. The bitstream generator is adjustable, and can produce bitstreams of different lengths, depending on the control signal. Increasing the bitstream length results in a greater dynamic range of the analog signal, and vice versa. A user can use a preexisting filter to perform the low pass filtering, by simply selecting a value of the control signal. Alternatively, the user can set a value of the control signal (based on an application's dynamic range requirement), and design the low pass filter based on the selected value of the control signal.

10 Claims, 6 Drawing Sheets

DIGITAL TO ANALOG CONVERTER (DAC) HAVING AN ADJUSTABLE DYNAMIC RANGE

BACKGROUND

An article entitled "A Single-path Multi-bit DAC for LP ΔΣ A/D Converters" by Loai Louis and Gordon W. Roberts, in Proceedings of IEEE Symposium on Circuits and Systems, Monterey, Calif. 1998 (that is incorporated by reference herein in its entirety) describes a digital-to-analog converter (DAC) based on encoding direct current (DC) levels in a sequence of bits (called "bitstreams"). The DAC converts a "multi-bit digital value into bitstreams which are then filtered by an analog filter to extract the DC levels encoded therein." (see abstract).

As noted in the article, such "bitstreams can be used to generate a variety of signals including DC levels. Thus, they can be used to encode the various levels corresponding to a multi-bit input code. A multiplexer can then decide, based on the input, which bitstream to output. For example, consider building a 3-bit midriser DAC to output levels between +/−1. . . . To encode one of the levels, $5/7$ for example, in a bitstream, with the two supplies being +/−1, a bitstream of length 7 containing 6 ones and 1 negative one is needed. This bitstream will average to $(6-1)/7=5/7$, giving the exact value required . . . the result of repeating a bitstream sequence is a series of tones @nFs/N, n=0, 1, . . . N, Fs being the clocking frequency and N the length of the bitstream sequence." A low pass filter (LPF) attenuates the Fs/N tones and leaves the required DC level.

Figure 1:
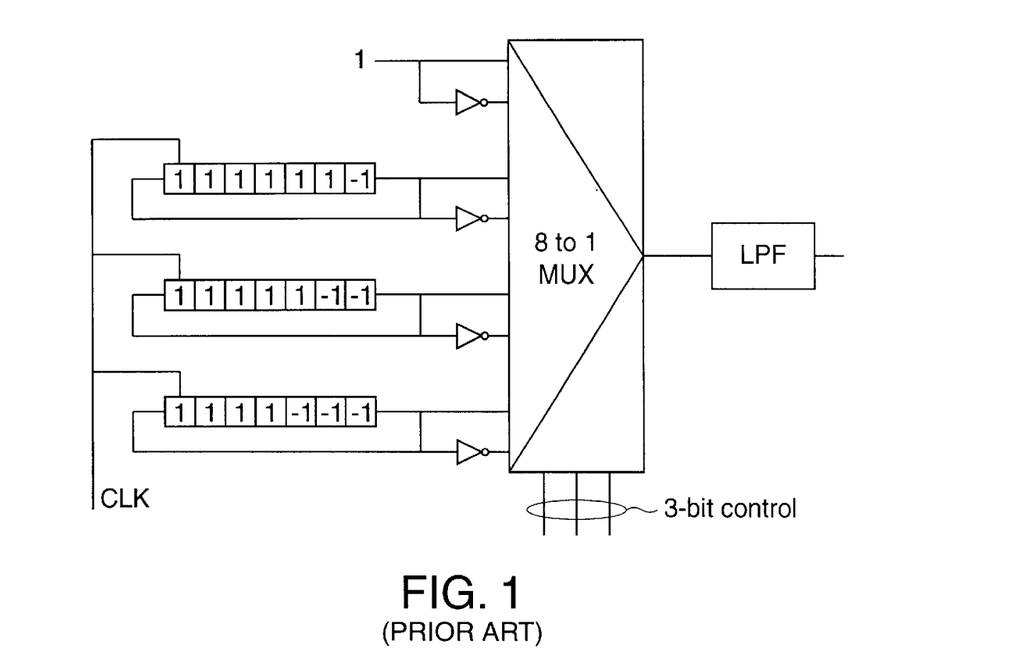
FIG. 1 shows a prior art digital to analog converter (DAC).

According to the above-described article, hardware savings are obtained by realizing that inverting the bitstreams of the positive levels results in the corresponding negative DC levels, saving half the bitstreams required. Thus, for a 3-bit DAC, only 3 bitstreams, each 7 bits long, are required (and a LPF) to implement the 8 levels. The article discloses storing the DAC's different output levels as the average values of several digital bitstreams, as illustrated in FIG. 1. The accuracy of the DAC depends on (1) order of the LPF (the more attenuation is provided, the closer to DC the levels are, but the filter usually takes longer to settle); and (2) the length of the bitstreams used (the shorter the bitstreams, the higher in frequency (nFs/N) the AC tones are located, requiring a lower order filter or e settling time. For short bitstreams, the AC components are fairly high in frequency, thus excluding the possibility of using noise-shaped bitstreams.

Note that the bitstream generator circuit in the above-described article could also be implemented using a finite-state machine or some other form of digital circuitry.

SUMMARY

A device in accordance with the invention includes a Digital to Analog Converter (DAC) having a dynamic range (ratio of the maximum output to the smallest output, expressed in, for example, decibels) that is adjustable. Specifically, the DAC (also called "adjustable DAC") has an input port to receive a digital signal to be converted into an analog signal, and also has, a control port to receive a control signal that indicates the dynamic range. The adjustable DAC provides an analog signal having a voltage that corresponds to the digital signal, and having the dynamic range indicated by the control signal. Therefore, the adjustable DAC can generate, for example, an analog signal in the range of 0 and 5 volts in increments of 1/n where n is any number that may be indicated by the control signal, such as an integer (e.g. 3, 4, 5, 6, 7, 8, 9, 10 . . . ).

In one embodiment, an adjustable DAC includes a circuit (called "tunable bitstream generator") that supplies to a low pass filter a periodic signal having its periodicity determined by the dynamic range signal (e.g. the periodicity is automatically decreased if the dynamic range is increased and vice versa). In one implementation, the tunable bitstream generator includes a state machine that dynamically generates a bitstream of variable length, wherein the length is determined by the dynamic range signal. For a given value of the dynamic range signal, the length of the bitstream remains fixed, and the bitstreams is repeatedly supplied by the bitstream generator to the low pass filter, which in turn generates the analog signal from the repeated bitstream.

An adjustable DAC of the type described above can be used in the normal manner, in any circuit that uses a DAC as long as the circuit provides the above-described control signal (which indicates the dynamic range to the DAC). In one embodiment, the circuit includes a storage element (such as a register) that is initialized with a value provided, for example, by a user. The user stores a dynamic range requirement in the storage element once, e.g. depending on the application in which the DAC is being used. Therefore, the adjustable DAC allows the same circuitry to be used in a number of applications that require different dynamic ranges, as long as the user stores the required dynamic range for each application in the respective circuit's storage element. Moreover, such a circuit (that uses the adjustable DAC) is not made obsolete if the only change is the dynamic range, because a new dynamic range can be stored at any time (in the above-described storage element). When a new dynamic range is stored, power to the circuit is turned off and on in one embodiment, to avoid transient signals (e.g. by resetting the above-described state machine).

In one embodiment, the tunable bitstream generator is implemented as a portion of an integrated circuit chip, while the low pass filter is implemented off-chip, e.g. on a printed circuit board. Such separation of the digital and analog portions of the adjustable DAC allows the user to design and implement a DAC the user needs. Specifically, tunability of the bitstream generator provides flexibility to the user in implementing the low pass filter. For example, a user may decide to use a first order low pass filter (formed by just a resistor and a capacitor), in which case the user provides a sufficiently low dynamic range to the bitstream generator to ensure that a first harmonic is sufficiently far away from the DC component. In another example, an application may need a high dynamic range, and the user may use a second or third order low pass filter despite the cost (because of the need). In both examples, an identical integrated circuit chip can be used, thereby to reduce cost (because of mass production of such chips).

The ability to arbitrarily define (by use of a storage element or otherwise) the dynamic range (as described above) supports the user's design of a DAC that is specific to each application. A tunable bitstream generator (described above) allows the user to achieve any dynamic range simply by supplying an appropriate control signal to the tunable bitstream generator, thereby to result in a flexible and easy-to-use DAC.

DETAILED DESCRIPTION

Dynamic range (sometimes referred to as "resolution" or "granularity") of an analog signal that can be generated by a digital to analog converter (DAC) 10 (FIG. 2A) is adjustable in accordance with the invention via a control signal at a control port 11. DAC 10 also has an input port 12 to receive the to-be-converted digital signal, and an output port 13 to supply the analog signal resulting from conversion of the digital signal. The control signal at port 11 and the input signal at port 12 may be supplied by the corresponding registers 14 and 15 that are optional and that respectively hold, for example, the dynamic range and the to-be-generated voltage.

Figure 2A:
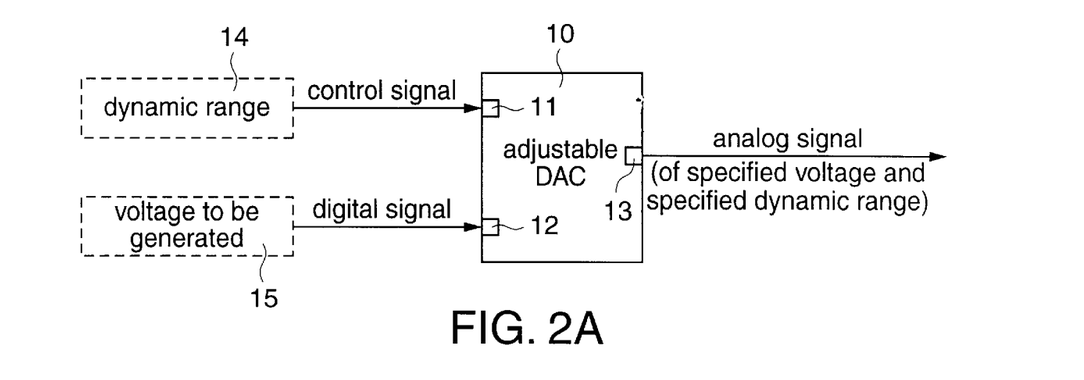
FIG. 2A illustrates, in a high level diagram, an adjustable DAC of the present invention.
Figure 2B:
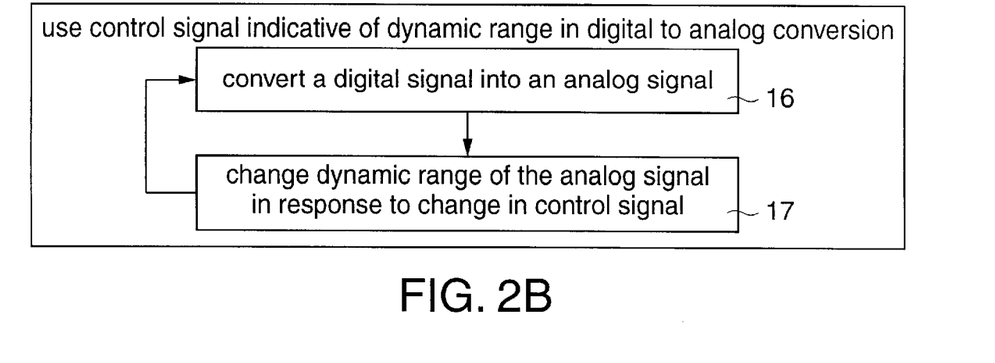
FIG. 2B illustrates, in a flow chart, an operation that uses a control signal of FIG. 2A during the digital to analog conversion, implemented by two acts in one embodiment of the invention.

DAC 10 converts a digital signal at input port 12 into an analog signal at output port 13 by using a control signal at port 11 to determine dynamic range of the analog signal during the digital to analog conversion. Specifically, DAC 10 converts (as illustrated by act 16 in FIG. 2B) a digital signal received at port 12 to a corresponding analog signal supplied at port 13 in the normal manner but responds to a change in the control signal at port 11 by adjusting the dynamic range of the analog signal. Such adjustability of DAC 10 allows DAC (also called "adjustable DAC") 10 to be used in a number of applications.

As an example, if a set of analog signals that can be generated by DAC 10 includes ten signals that cover a range of values 1 to 10 in increments of 1, then adjustable DAC 10 replaces this set by another set that has one hundred signals that cover the same range but in increments of 0.1 when a control signal at port 11 is, for example, increased. In contrast, prior art DACs (including the DAC disclosed in FIG. 1 of the above-described article) are believed to have a predetermined dynamic range that cannot be changed, without changing circuit components inside the prior art DAC. Although in the above-described example, the range of 1–10 was used, in many applications the range is either 0 and 3.3 volts or 0 and 5 volts.

Figure 3A:
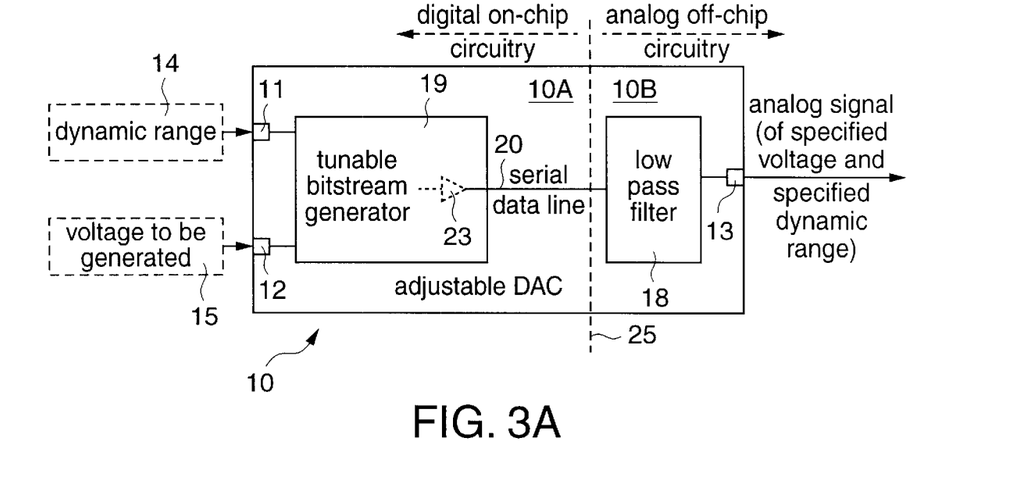
FIG. 3A illustrates use of a tunable bitstream generator and a low pass filter to implement the adjustable DAC of FIG. 2A.

One embodiment of adjustable DAC 10 has a digital portion (illustrated on the left side of line 25 in FIG. 3A) 10A implemented in an integrated circuit chip 10 and an analog portion (illustrated on the right side of line 25 in FIG. 3A) 10B implemented off-chip. In this embodiment, digital portion 10A is adjustable (e.g. is responsive to different values received at a port 11) so that a number of such chips 10 can be used in a corresponding number of applications (e.g. by interfacing to a corresponding number of different analog portions 10B). Therefore, any digital portion 10A can be coupled to any analog portion 10B, irrespective of the dynamic range of DAC 10. Thus DAC 10 being adjustable allows users to buy an integrated circuit chip (that contains digital portion 10A) regardless of the type of analog portion 10B with which the chip is to be interfaced. Also, adjustable DAC 10 allows the user to use an existing chip when the user replaces a currently used analog portion 10B with a new one. Adjustability of DAC 10 further allows a designer of the integrated circuit chip to disregard the type of analog portion 10B with which the chip may be used.

In one embodiment, DAC 10 includes a bitstream generator 19 (FIG. 3A) and a low pass filter 18 that are similar or identical to the corresponding components disclosed in the above-described article (see FIG. 1), except for the differences noted below. Bitstream generator 19 (FIG. 3A) is coupled to each of control port 11 and input port 12. A serial data line 20 couples bitstream generator 19 to low pass filter 18 that in turn is coupled to output port 13. Depending on the implementation, ports 11 and 12 can have either a single terminal (thereby to carry a serial data signal) or multiple terminals (thereby to carry a parallel data signal).

Figure 3B:
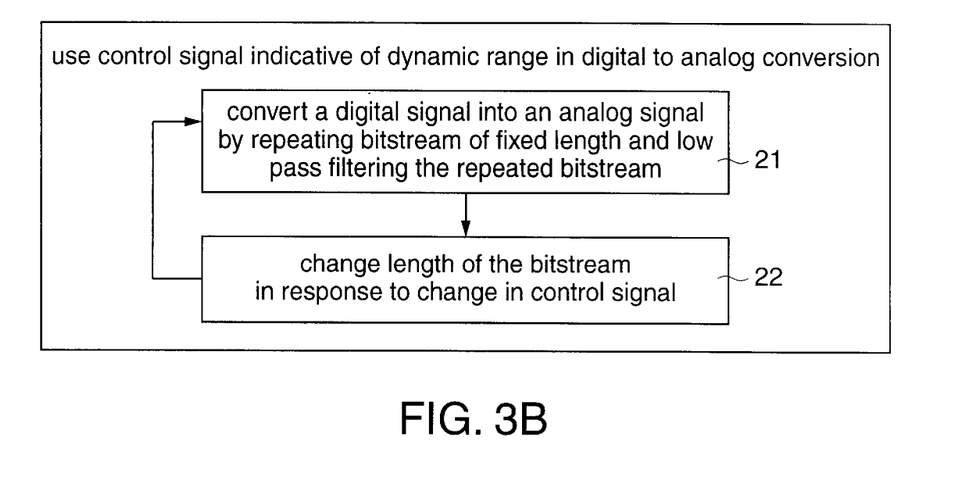
FIG. 3B illustrates, in a flow chart, acts performed by the circuitry of FIG. 3A.

Bitstream generator 19 (FIG. 3A) repetitively generates a bitstream of a fixed length (e.g. 7 bits) and filter 18 filters the harmonics from repeated bitstream (as illustrated by act 21 in FIG. 3B). As noted above, port 11 (FIG. 3A) carries a control signal that defines the precision with which output signals generated by low pass filter 18 can be chosen within a range of minimum and maximum values. Bitstream generator 19 responds to a change in the control signal (at port 11; see FIG. 3A), by changing the length of a bitstream that is repeated (as illustrated by act 22 in FIG. 3B), and therefore also changes the frequency with which the bitstream is repeated. Hence, the control signal determines the periodicity of bitstream generator (also called "tunable bitstream generator") 19, and is in one embodiment, expressed as the length (or period) of the bitstream (in terms of the number of clock cycles), instead the above-described ratio of the maximum output to the smallest output.

Higher values of the control signal result in more narrow differences between DC voltages that can be generated by low pass filter 18, but require more complex and costly circuitry in low pass filter 18, to remove AC harmonics from the desired DC signal. This is the case because higher values produce harmonics that are closer to the DC voltage (0 Hz). An appropriate value of the control signal may be chosen by a user, for a specific application, and programmed into storage element 14 when initialized.

Low pass filter 18 removes the alternating current (AC) harmonics from the signal transmitted from bitstream generator 19. The output of low pass filter 18 for most applications is a DC value that has a maximum voltage of 3.3 V and a minimum voltage of 0 V. Optionally, a Transistor Transistor Logic (TTL) buffer/amplifier (not shown in FIG. 3A; see FIG. 7) can be used between the output of bit stream generator 19 and input of low pass filter 18, to increase the range at output port 13 to 5 V from 3.3 V.

The precise value of the output signal supplied by low pass filter 18 to output port 13 depends on the period (or length) of the bitstream as defined by the control signal at port 11, and on the input signal at port 12 which defines the voltage to be generated. The voltage to be generated may be specified, for example, in terms of the number of clock cycles (called "count_hi") in the period, for which the signal on serial data line 20 remains high.

When the signals at ports 11 and 12 are expressed in this manner (as period and count_hi), the output signal generated by filter 18 is determined by the formula (output=3.3* count_hi)/period (assuming 3.3 is the maximum value in the range of possible values). Note that count_hi=period * (desired_output_in_volts/max_output_in_volts). A driver 23 amplifies the serial data signal produced by bitstream generator 19 to be sufficiently large in magnitude to be filtered by low pass filter 18.

Figure 4A:
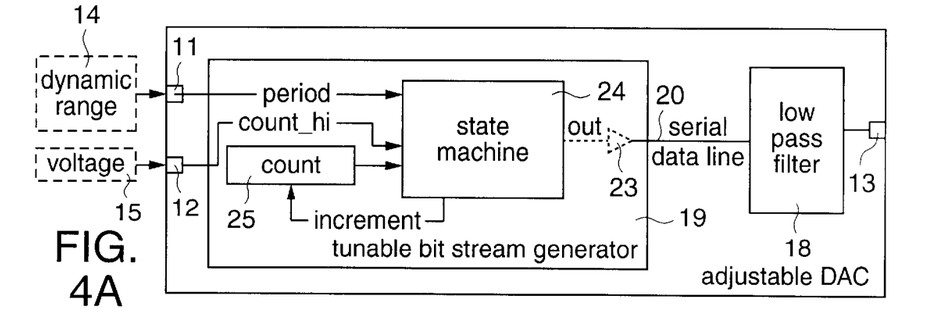
FIGS. 4A and 4C illustrate two alternative implementations of the tunable bitstream generator of FIG. 3A.

Bitstream generator 19 may be implemented by a state machine 24 (FIG. 4A) that counts from zero to the count_hi value (stored in register 15 for example) and transmits high bit pulses (e.g. at 1 volt) to the driver 23 and low pass filter 18 each time a counter 25 is incremented until count_hi is exceeded. The value in counter 25 increases by one each time it is augmented. After count_hi is exceeded, low bit pulses (e.g. at 0 volt) are transmitted for each augmentation of counter 25, until the counter value exceeds the period value. After counter value reaches the period value, counter 25 is reset to zero and the count value is augmented to count_hi again, repeating the process of counting the period value again.

State machine 24 (FIG. 4B) begins is in its initial state 42 in which the counter value is reset to zero and the output transmitted from bitstream generator 19 on serial data line 20 is 0. Next, if an enable signal (not shown in FIG. 4A) is active, state machine 24 enters a first state (also called "high state") 43 in which counter 25 is incremented by one, and a high bit pulse is transmitted from bitstream generator 19 repeatedly until the value in counter 25 equals the count_hi value stored in register 15.

Figure 4B:
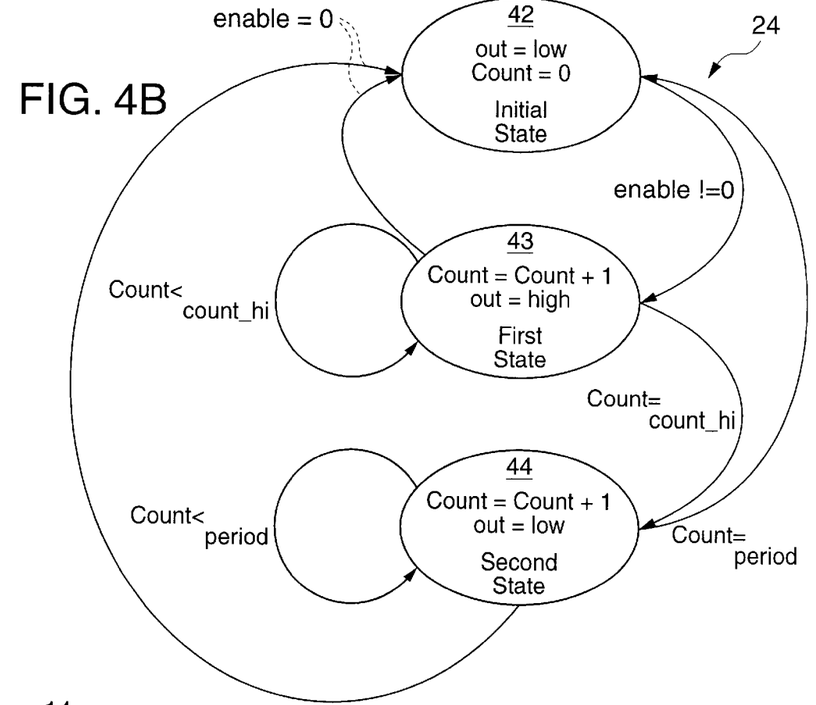
FIG. 4B illustrates, in a state diagram, a state machine of FIG. 4A.

When the counter value in state machine 24 equals the count_hi value, state machine 24 transfers to second state (also called "low state") 44 in which it continues to increment its counter value, but transmits low bit pulses each time counter 25 is incremented. State machine 24 continues to augment the counter value after count_hi has been exceeded, and transmits low pulses to driver 23, until the period value in register 14 has been reached by the value in counter 25.

Once the period value has been reached, state machine 24 transfers back to initial state 42, resets the counter value to zero, and if enable is still active transfers to first state 43. As noted above, in first state 43, state machine 24 transmits a high value from bitstream generator 19 again upon each increment of the counter value. The high and low pulses transmitted by the state machine 24 are amplified by driver 23 and filtered by low pass filter 18, producing a DC signal of the desired level.

Note that to avoid transient signals, the period that is used in second state 44 is changed only when state machine 24 is in initial state 42, e.g. when state machine 24 is halted and serial data is not being supplied on line 20. As seen from FIG. 4B, state machine 24 can be halted by driving an enable signal to inactive (e.g. low if the enable is an active high signal). Alternatively, after a change in period (e.g. after a new period is stored in nonvolatile memory e.g. storage element 14), state machine 24 is reset (e.g. powered on/off) to effectuate use of the new period to generate a new serial data signal on line 20. Alternatively, if it is necessary to change the period during operation, transient signals are suppressed (by circuitry that will be apparent to the skilled person in view of the disclosure).

One implementation of state machine 24 is illustrated by the software in Appendix A that is attached hereto. The software describes a model in the language VERILOG.

Figure 4C:
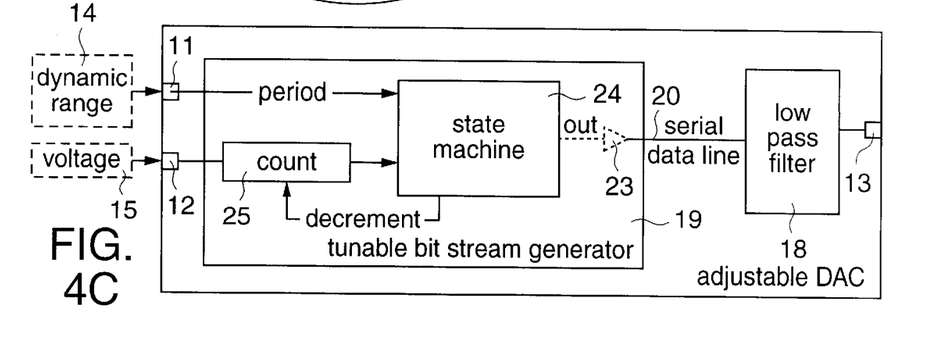
Figure 5:
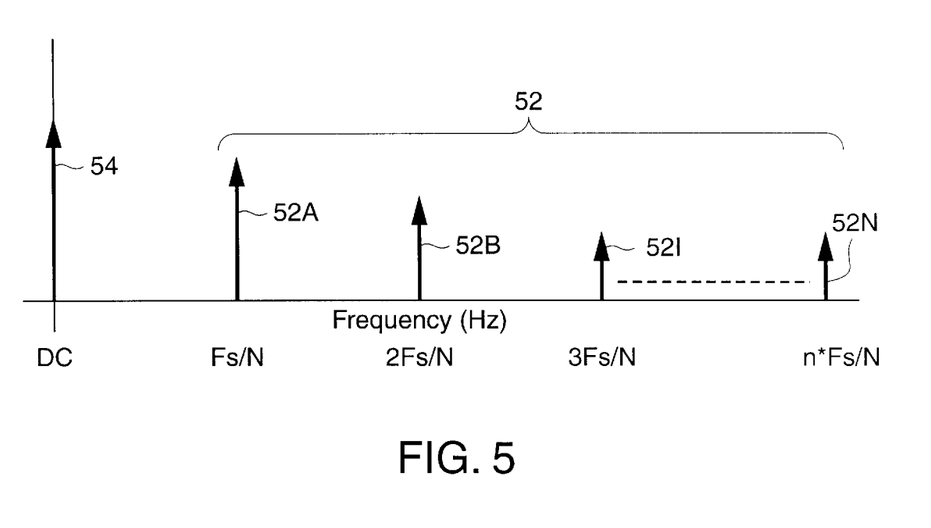
FIG. 5 illustrates, in a graph, a signal generated by the bitstream generator, in the frequency domain.

Note that instead of incrementing counter 25, the counter can be decremented in which case counter 25 latches the digital value received at port 12 initially e.g. in response to a control signal from state machine 24 as illustrated in FIG. 4C. FIG. 5 shows a signal transmitted by bitstream generator 19 (on the serial data line 20) in the frequency domain, before it is filtered. As the graph illustrates, the signal includes a direct current (DC) portion 54 and a number of harmonics 52A–52N (wherein $A \leq I \leq N$, N being the number of harmonics shown in FIG. 5). A first harmonic 52A is at Fs/period, the second harmonic 52B is at 2*Fs/period, and the nth harmonic 52N is at n*Fs/period, wherein Fs is the clocking frequency of bitstream generator 19. If the period is decreased (in the manner described above in reference to FIG. 3A), the spacing between the harmonics 52A–52N expands, and vice versa. In contrast, prior art circuits known to the applicants do not permit any change in the period.

In one example, Fs=100 MHz, and period=64, the first harmonic is at 100 MHz/64 =1.5625 MHz, the second harmonic is at 2*1.5625 MHz, and so forth. Period defines the spacing of harmonics transmitted by bitstream generator 19 and the precision with which the pulse train 52 can be filtered out thereby to extract DC component 54. The voltage of DC component 54 is a function of the duty cycle. For example if period is 63 and count_hi is 62, the voltage, after appropriate low-pass filtering is 62/63 * 3.3=3.248 Volts. When count_hi is set to 1, the output voltage will be 1/63* 3.3 volt=$5.238 \times 10^{-2}$ Volts.

For a period N (in number of cycles) of value 64, the first harmonic is at a frequency greater than 1 MHz, and therefore a first-order low-pass filter provides adequate suppression of the first harmonic. For example, for R=22 K ohms and C=0.36 $\mu$f, the corner frequency $F_{corner}$ is at 1/RC=126.26 rad/sec or $F_{corner}$=126.26/2$\pi$=20.10 Hz. For N=64 and $F_{corner}$=20.1 Hz, and with a first harmonic at 1.5625 MHz, the attenuation of the first harmonic is over 96 dB. For a period length of 65535 (216), the attenuation of the first harmonic is 38 dB, which is still acceptable if the desired dynamic range of the output voltage is less than 38 dB.

Figure 6:
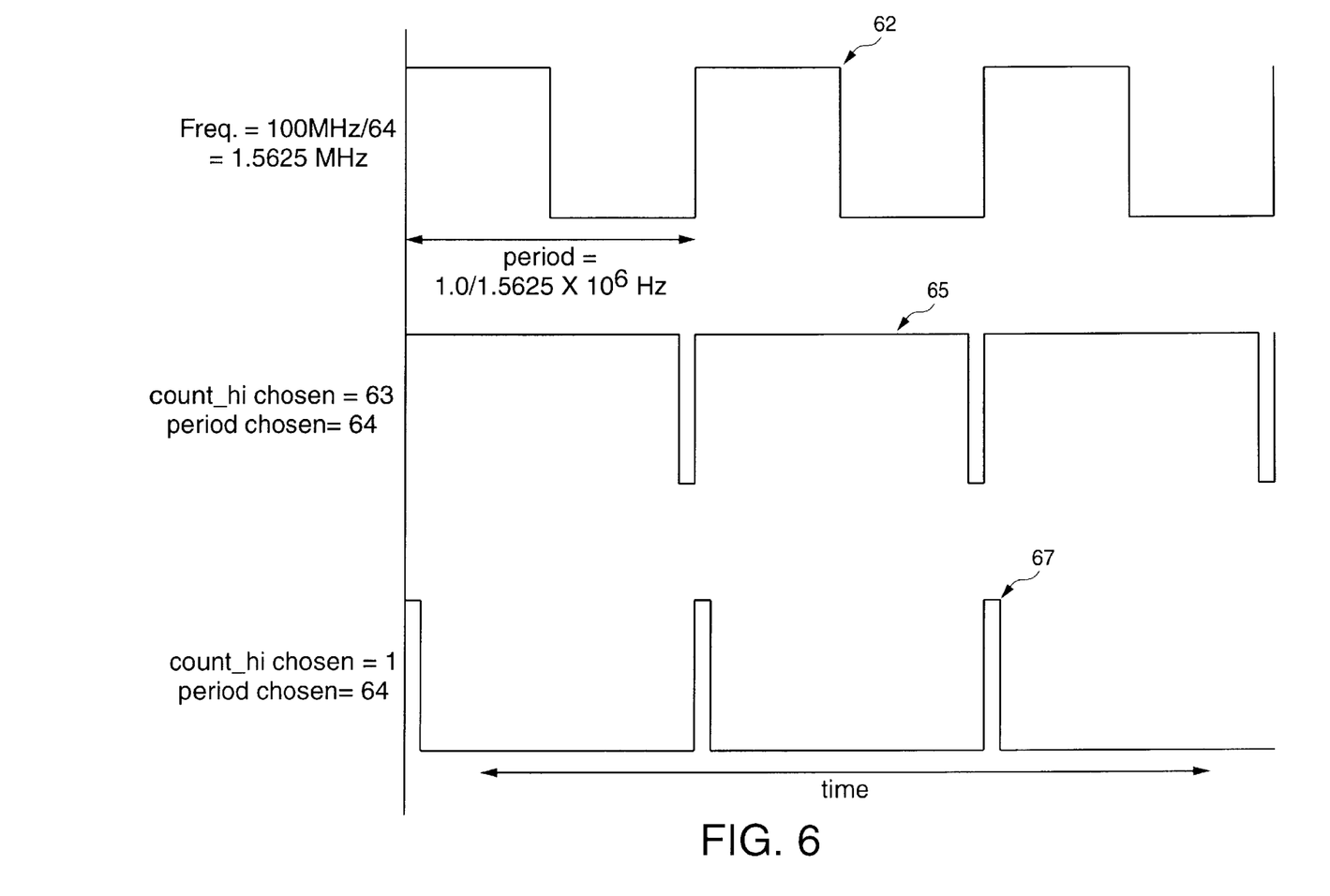
FIG. 6 illustrates, in a graph, the signal of FIG. 5 in the time domain.

FIG. 6 illustrates timing diagrams of the pulse trains transmitted by the bitstream generator 19 in the time domain before the stream is filtered. Waveform 62 shows a typical clock pulse with a frequency of 100 MHz/64=1.5625 MHz, where 64 is a typical period chosen by the user. Waveform 62 serves as a point of reference for discussion of the other waveforms, 65 and 67. Waveform 65 shows the bits transmitted from the bitstream generator 19 when count_hi is 63 and the period 64. Waveform 67 shows the bitstream transmitted from the generator 19 when count_hi is one and the period is 64.

There are tradeoffs inherent in the choice of a value for the period N and in the selection of low pass filter 18 for use in forming DAC 10. The user (such as a designer) should consider the following trade-offs:

1. Using a higher value of N (longer pulse period) creates an output voltage with greater dynamic range, meaning that DC values can be chosen with higher precision between the minimum and maximum values. However, use of a higher N value places the harmonics 52A–52N (FIG. 5) closer to DC component 54, and may therefore require a filter with steeper roll-off or lower cut-off frequency. Such filters are more costly and more complex than simpler first order filters that can be used when N is not high 2. Using a lower value of N reduces the dynamic range of the output voltage. This places harmonics 52A–52N farther away from DC component 54. This allows the use of a lower order filter or a filter with a higher cut-off frequency, which reduces filter complexity and saves cost.

A user may decide to use a simple first order filter formed by a resistor and a capacitor, and may use components that are available in-house to build the filter. In such a case, the user can simply compute the period (as described herein) and store the period in a storage element 14 for use by DAC 10 as described above. Storage element 14 may be formed, for example, in a nonvolatile memory (such as EEPROM), so that the user does not need to provide the period more than once. Use of a bitstream generator 19 that can tune the length of the bitstream permits the use of a number of different filters 18 in forming DAC 10. Alternatively, a user may start with a period, and determine the type of filter necessary to isolate the DC component.

The value of the DC component depends on the application in which the DAC 10 is used. In one possible application, a local clock is compared to a network clock to determine count_hi, based upon the difference between these two clocks. A serial data signal is produced by the bitstream generator 19 containing a quantity of "high" bits equal to count_hi. As noted above, this serial data signal is filtered by low pass filter 18, producing a DC value that can be used to drive a voltage controlled oscillator (VCXO). The voltage controlled oscillator transmits an adjusted local clock (derived from the DC value it receives from low pass filter 18). The just-described acts can be repeated in a feedback loop until the local clock matches the network clock.

In one such embodiment, VCXO 110 (FIG. 7) receives the DC signal generated by filter 18 and provides a local clock to a buffer 123 via a line 128. Buffer 123 holds data (received via line 129) from a network (such as a Telephony Central Office, or Cable Modem head-end) that is clocked by a network clock (not shown in FIG. 7). The network clock is not explicitly known to chip 120 (which may be any kind of networking chip). Instead, chip 120 uses the local clock on line 128 that closely matches the network clock when synchronized, e.g. as described in the ATM specification entitled "Voice and Telephony Over ATM to the Desktop Specification", af-vtoa-0083.000, May, 1997 that is incorporated by reference herein in its entirety.

Figure 7:
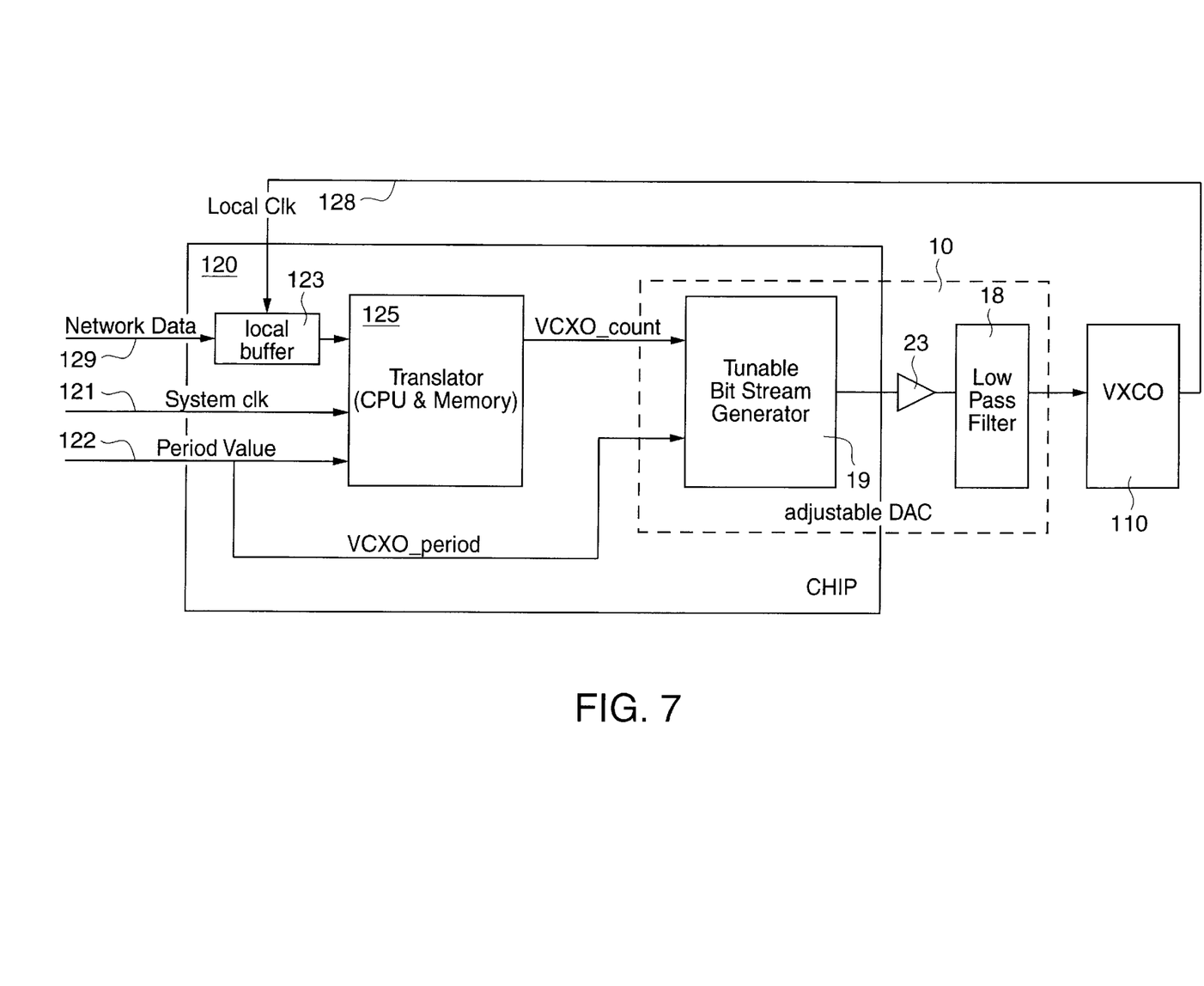
FIG. 7 illustrates use of the adjustable DAC by a network device to synchronize a local clock to a system clock.

When synchronized in this manner, the local clock is used to clock the local buffer 123 that operates in synchronization with the network. Local buffer 93 stores multiple data packets received from the network for transmittal to local network devices in order to reduce jitter problems. Jitter is produced because data packets transferred from the network to the local buffer 93 (also called "jitter buffer") are not transferred at a constant rate. Chip 120 also receives a system clock (on line 121) that clocks various portions of chip 120, such as a CPU and memory that may be included in a translator 125. The just-described system clock also clocks the tunable bitstream generator 19.

Therefore, output of low pass filter 18 can be used to vary the VCXO 110's center frequency of 2.048 or 4.096 MHz (which are typical clock frequencies used in telephony) within a range of a few hundred Parts Per Million (PPM). Bitstream generator 19 transmits a pulse train to low-pass filter 18 at a fraction of the network clock frequency. This fraction is equal to Fs/period, the system clock frequency Fs divided by period.

Translator 125 calculates an error signal related to the phase difference between the local clock and the network clock as follows. Translator 125 uses the fullness of the local buffer 123 to determine if the local clock signal is running faster or slower than the network clock signal. If the fullness of local buffer 123 drifts above or below a predetermined level (e.g. by a predetermined amount), then the local clock on line 128 is not sufficiently synchronized with the network clock. Translator 125 calculates an error/control signal based upon the fullness of local buffer 123. This control/error signal is used to determine count_hi. In response to a change in count_hi, DAC 10 changes the output signal in the normal manner, and therefore the VCXO changes the frequency of the local clock on line 128 thereby to cause fullness of buffer 123 to be closer to the predetermined level. This process may be repeated if the above-described condition on the buffer fullness is satisfied, in a feedback loop, until local clock matches the network clock.

Numerous modifications and adaptations of the embodiments and implementations described herein will be apparent to the skilled artisan in view of the disclosure. For example, in an alternative implementation, the bitstream generator stores several sets of bitstreams, wherein each set corresponds to one of a corresponding number of dynamic range signals. In such an alternative implementation, the value of N (described above) may change by a factor of 2, and the dynamic range signal may indicate a predetermined N value such as one of 32, 64, 128 and 256 if the corresponding four sets of bitstreams are stored in the bitstream generator. Numerous such modifications and adaptations are encompassed by the attached claims.

---

APPENDIX A

```
//****************************************************************
// Implementation Notes:
// (1) if count_hi is 0, the output is 0
// (2) else if period = count_hi, the output is 1
// So, if period=count_hi=0, the output is 0
// the period register value is latched into internal buffer
// when enable bit is from 0 to 1.
// So, to change the period, SW needs to disable the enable bit
// and then update period and enable
// When period is 0 and coount_hi is not 0, period is actually 2^16
// When period <= count_hi, the output is 1
// The count starts 2 cycles after enable is set
//****************************************************************
module wan_vcxo(clk_in, reset, period_reg, enable_reg, count_hi_reg, vcxo_out);
    input           clk_in;
    input           reset;
    input   [15:0]  period_reg;
    input           enable_reg;
```

-continued

APPENDIX A

```
input      [15:0]   count_hi_reg;
output              vcxo_out;
reg        [15:0]   count;
reg        [15:0]   next_count;
wire       [15:0]   count_plus_1;
reg        [15:0]   period_buf;
reg        [15:0]   count_hi_buf;
wire                enable_1t;
reg                 enable_reg_s;
reg                 vcxo_out;
reg                 next_vcxo;
always @(posedge clk_in)
        if(reset)   count[15:0] <= 16'h0;
        else                count[15:0] <= next_count[15:0];
// internal period_buf is re-loaded when enable_reg is from 0 to 1
always @(posedge clk_in)
        if(reset)   period_buf[15:0] <= 16'h0;
        else if (enable_1t) period_buf[15:0] <= period_reg[15:0];
always @(posedge clk_in)
        if(reset)              count_hi_buf[15:0] <= 16'h0;
        else if (!enable_reg_s)    count_hi_buf[15:0] <= count_hi_reg[15:0];
        else if(count_hi_buf==0) count_hi_buf[15:0] <= count_hi_reg[15:0];
        else if (count_plus_1==period_buf)
                                  count_hi_buf[15:0] <= count_hi_eg[15:0];
always @(posedge clk_in)enable_reg_s <= enable_reg;
assign    enable_1t = enable_reg && !enable_reg_s;
assign    count_plus_1 [15:0] = count[15:0] + 1'b1;
always @(enable_reg_s or count_hi_buf or count_plus_1 or period_buf)
        if(!enable_reg_s)          next_count[15:0] = 16'h0;
        else if(count_hi_buf==0)   next_count[15:0] = 16'h0;
        else if(count_plus_1==period_buf) next_count_[15:0] = 16'h0;
        else                            next_count[15:0] = count_plus_1;
always @(reset or count or count_hi_buf or enable_reg_s)
        if (reset)                              next_vcxo = 1'b0;
        else if(!enable_reg_s)                  next_vcxo = 1'b0;
        else if(count_hi_buf[15:0]=0)           next_vcxo = 1'b0;
        else if(count[15:0] < count_hi_buf[15:0]) next_vcxo = 1'b1;
        else                                    next_vcxo = 1'b0;
always @(posedge clk_in) vcxo_out <= next_vcxo;
endmodule
```

What is claimed is:

1. A digital to analog converter comprising:

an input port for receipt of a digital signal;

a control port for receipt of a control signal;

an output port for supply of an analog signal, wherein voltage of the analog signal corresponds to the digital signal, and dynamic range of the analog signal corresponds to the control signal;

a bitstream generator coupled to the input port and to the control port, the bitstream generator having a serial data line;

a low pass filter coupled to the serial data line and to the output port; and an amplifier coupled between the bitstream generator and the low pass filter.

2. A digital to analog converter comprising:

an input port for receipt of a digital signal;

a control port for receipt of a control signal;

an output port for supply of an analog signal, wherein voltage of the analog signal corresponds to the digital signal, and dynamic range of the analog signal corresponds to the control signal;

a bitstream generator coupled to the input port and to the control port, the bitstream generator having a serial data line; and a low pass filter coupled to the serial data line and to the output port;

wherein the bitstream generator includes:

a storage element; and a state machine coupled to the storage element, the control port and the serial data line;

wherein the bitstream generator lacks storage elements for holding a plurality of bitstreams and the bitstream generator also lacks a multiplexer for selecting one of the bitstreams;

wherein the state machine includes:

a first state in which the state machine drives a signal to a first state on the serial data line;

a second state in which the state machine drives the signal to a second state on the serial data line;

wherein in each of the first state and the second state the state machine changes a signal in the storage element in an identical manner, said change being one of (incrementing and decrementing).

3. The digital to analog converter of claim 2, wherein the state machine transitions from the first state to the second state depending on the signal in the storage element.

4. The digital to analog converter of claim 2, wherein:

the change is incrementing; and the state machine causes one bit to be transmitted by said bitstream generator for each instance the signal in the storage element is incremented and is less than or equal to said digital signal.

5. The digital to analog converter of claim 2, wherein:

the change is incrementing; and the state machine circuit causes a zero bit to be transmitted by said bitstream generator each time the signal in the storage element is incremented and is greater than said digital signal and less than or equal to the control signal.

6. A network device including a digital to analog converter, the digital to analog converter comprising:

an input port for receipt of a digital signal;

a control port for receipt of a control signal;

an output port for supply of an analog signal, wherein voltage of the analog signal corresponds to the digital signal, and dynamic range of the analog signal corresponds to the control signal;

the network device further comprising:

a voltage-controlled oscillator that generates a clock signal; and a local buffer that holds data from a network, wherein the local buffer uses the clock signal to read out the data; and a translator coupled to the local buffer to receive therefrom a signal related to fullness of the local buffer, the translator being also coupled to the control port to receive therefrom the control signal, and the translator being further coupled to the input port to supply thereto the digital signal.

7. A network device including a digital to analog converter, the digital to analog converter comprising:

an input port for receipt of a digital signal;

a control port for receipt of a control signal;

an output port for supply of an analog signal, wherein voltage of the analog signal corresponds to the digital signal, and dynamic range of the analog signal corresponds to the control signal;

the network device further comprising:

a voltage-controlled oscillator that generates a clock signal; and a local buffer that holds data from a network, wherein the local buffer uses the clock signal to read out the data; and a storage element that latches the control signal.

8. A method of converting a digital signal to an analog signal, the method comprising:

using a control signal to determine dynamic range of the analog signal obtained from digital to analog conversion;

converting the digital signal into the analog signal by repeating a bitstream of a predetermined length and low pass filtering the repeated bitstream; and changing the length of the bitstream in response to change in the control signal;

storing the control signal; and selecting a low pass filter based on the control signal.

9. A method of converting a digital signal to an analog signal, the method comprising:

using a control signal to determine dynamic range of the analog signal obtained from digital to analog conversion;

converting the digital signal into the analog signal by repeating a bitstream of a predetermined length and low pass filtering the repeated bitstream; and changing the length of the bitstream in response to change in the control signal;

selecting a low pass filter;

determining the control signal based on the selected low pass filter; and storing the control signal.

10. A digital to analog converter having an input port, a control port, and an output port, the digital to analog converter comprising:

a digital circuit coupled to the input port to receive therefrom a digital signal, the digital circuit being further coupled to the control port, the digital circuit having a serial data line;

wherein data on the serial data line has a periodicity related to a control signal at the control port; and an analog circuit connected to the serial data line, the analog circuit being further coupled to the output port;

the digital circuit is formed in an integrated circuit chip;

the analog circuit is formed outside the integrated circuit chip; and the digital circuit includes a driver formed in the chip and coupled to the serial data line; and the analog circuit includes an amplifier coupled to the serial data line.

* * * * *